(12) United States Patent
Zeng (10) Patent No.: US 10,544,929 B2
(45) Date of Patent: Jan. 28, 2020

(54) LIGHTING APPARATUS (71) Applicant: XIAMEN ECO LIGHTING CO. LTD., Xiamen (CN)

(72) Inventor: Maojin Zeng, Xiamen (CN)

(73) Assignee: XIAMEN ECO LIGHTING CO. LTD., Xiamen (CN)

( * ) Notice: Subject to any disclaimer, the term of this patent is extended or adjusted under 35 U.S.C. 154(b) by 0 days.

(21) Appl. No.: 15/860,663

(22) Filed: Jan. 3, 2018

(65) Prior Publication Data

US 2019/0107272 A1 Apr. 11, 2019

(30) Foreign Application Priority Data

Oct. 11, 2017 (CN) ..................... 2017 2 1303399 U (51) Int. Cl.
*F21V 23/00* (2015.01)
*F21V 23/06* (2006.01)
*H01R 12/70* (2011.01)
*H05K 1/18* (2006.01)
*F21Y 115/10* (2016.01)
*F21V 3/00* (2015.01)
*H01R 12/58* (2011.01)
*F21V 3/04* (2018.01)
*H01R 12/71* (2011.01)
*H01R 12/57* (2011.01)

(52) U.S. Cl.
CPC .............. *F21V 23/005* (2013.01); *F21V 3/00* (2013.01); *F21V 3/04* (2013.01); *F21V 23/001* (2013.01); *F21V 23/06* (2013.01); *H01R 12/58* (2013.01); *H01R 12/7005* (2013.01); *H05K 1/181* (2013.01); *F21Y 2115/10* (2016.08); *H01R 12/57* (2013.01); *H01R 12/716* (2013.01); *H05K 2201/10106* (2013.01)

(58) Field of Classification Search
None
See application file for complete search history.

(56) References Cited

U.S. PATENT DOCUMENTS

2013/0016509 A1* 1/2013 Van de Ven ............... F21V 7/00
                                                        362/235
2015/0198324 A1* 7/2015 O'Brien ............... F21V 33/0052
                                                        362/294
2016/0061434 A1* 3/2016 Huang .................. F21V 29/713
                                                        362/373

* cited by examiner

*Primary Examiner* — Ashok Patel
(74) *Attorney, Agent, or Firm* — Chun-Ming Shih; LanyWay IPR Services (57) ABSTRACT

A lighting device includes a plurality of light source circuit components, a circuit base board and an electrical connector module. Said circuit base board is used for carrying said plurality of light source circuit components. The plurality of light source circuit components are electrically connected to each other through the connecting wire of the circuit base board. The electrical connector module has a standard interface structure and an input terminal structure. Said input terminal structure has a plastic housing and a metal conductor. Said metal conductor is electrically connected to the connecting wires of said circuit base board. The standard interface structure has a standard interface and is connected to the external interface of the corresponding external conductor through a pluggable method.

20 Claims, 8 Drawing Sheets

LIGHTING APPARATUS

FIELD OF INVENTION

The present invention is related to a lighting device, and more particularly related to a lighting device provided with a circuit base board and connection terminals

BACKGROUND

LED light is a new lighting source. Because of its high luminous efficiency, long life span, energy saving, vandal-resistant, and environmental, it has been gradually used in home, office, public facilities, etc.

LED bulbs are new energy-saving lamps that replace the traditional incandescent lamps. Traditional incandescent lamp and tungsten filament lamp take high energy consumption and have short life span. Because of the limited global natural resources, those have been gradually banned to product by the governments, followed by the electronic energy-saving lamp, although the electronic energy-saving lamp saved energy, because the heavy metal elements used in the manufacturing process, which would lead to environmental pollution, but also is contrary to the big trend of environmental protection. With the rapid development of LED technology, LED lighting has become a new choice of green lighting. LED is much better than traditional lighting products in the lighting principle, energy saving, and environmental protection. As the incandescent and electronic energy-saving lamps still occupy a very high proportion in people's daily life, in order to reduce waste, LED lighting manufacturers must develop LED lighting products which are in line with the existing interface and the using habit, thus users can use the new LED lighting products without replace the original traditional lighting base and line. Therefore, LED bulb is emerged at the right moment. LED bulb uses the existing interface, that is, screw and socket, and even imitates the shape of the incandescent bulb to conform to people's habits.

The current LED bulb has reached the basic requirements to apply, and the price is also acceptable, but because of the better appearance or light angle of the LED lighting device, especially the similar appearance to the traditional incandescent, the LED lighting device has been accepted as the final version of the LED bulb. But the LED lighting device is still unable to implement to the market in quantity, the reason is the expensive the LED light bar material, although mass production or modifying the material specification may reduce the cost of materials, there are still some problems in the current process yield, so that the current cost of LED light bar can't be reduced. And because of the shape of the LED light bar itself. It is difficult to dissipate heat, which not only accelerates the light failure of the LED light bar, more seriously affect the life span of LED light bar. Therefore, it important to improve heat dissipation capability of the LED light for LED lighting devices.

In addition to the bulb, down light and other lights, light source board containing LED light source will also be used in the actual design. In the production of various lighting devices, the technical problems of external connections often need to be dealt with. Currently in North America and some regions, the IDEAL interface is a standard interface to an external power supply.

It is a key technical problem to properly handle the connection to a standard interface when narrowing down or reducing cost goals for down lights, bulbs, or similar lighting devices.

SUMMARY OF INVENTION

An embodiment of the present invention includes a lighting device that includes a plurality of light source circuit components, a circuit base board and an electrical connector module.

The circuit base board is used for carrying the plurality of light source circuit components. The light source circuit components mentioned herein may include, but are not limited to, LED components and corresponding driver circuit.

According to an embodiment of the present invention, the circuit base board is used only for providing light source circuit components such as driver circuit, and another light source board is used for carrying light emitting components such as LED components.

According to another embodiment of the present invention, a LED component and a driver circuit required thereon are simultaneously arranged on the circuit base board. For this type, currently there is a used term called DOB (Driver on Board).

DOB (Driver on Board) or Driverless, which is commonly referred to as power-less, a new driving mode that differentiates from traditional switching power supply, and based on LED characteristics.

DOB technology is gradually accepted by the market at present, various performance indicators tend to be more mature, more and more LED manufacturers began to provide DOB products, and market size of DOB can account for at least 30% to 40% of the total LED lighting market.

In the case of technology, DOB is a platform, which is to configure the LED light source and driver circuit on the same base board, and the driver circuit can use Linear or Switch architecture.

DOB can effectively reduce full-system costs, and market acceptance has increased dramatically. DOB can provide new flexibility for lights, which can solve stroboscopic problems if an appropriate AC design is adopted. Due to the simplicity of DOB and the integration of different gateway-connected sensors, DOB will play an important role in the field of intelligent lighting in the future.

Efficient driver circuit and high-voltage LED are the building blocks of DOB. LED driver in light costs account for about 20%, not only affect the cost, the light efficiency, but also determines the life of LED lights These driver circuit components and the LED components are connected to each other through the connecting wires of the circuit base board. It must be noted that the connecting wire mentioned here does not necessarily need to be in the form of a strip conductor, but may be in various forms that provide the electrical connection for the circuit components. For example, the circuit base board may have one or more conductor layers that are responsible for electrical connection for the circuit components, which should be connected. In addition, fixed or non-fixed wires may be soldered on the surface of the circuit base board to connect different circuit components. In addition, a metal foil of various geometric shapes may also be disposed on the circuit base board for connecting the LED components and heat dissipating.

In these embodiments, an electrical connection terminal module is further included. The electrical connection terminal module has a standard interface structure and an input terminal structure, and the input terminal structure has a plastic housing and a metal conductor. In different embodiments, the metal conductor mentioned herein may be metal wire, metal strip, metal clip, or a plurality of interconnected metal parts, and may further include related circuit, such as fuse, controller, communication component, etc.

The metal conductor is positioned through the plastic housing. In other words, the plastic housing provides proper support by means of a mold or the like as required. The metal conductors are mounted on the interior, the surface or other positions of the plastic housing so that the metal conductors can be fixed in a predetermined position.

The metal conductor is electrically connected to the connecting wires of the circuit base board. For example, there are two sets of metal conductors, corresponding to the two electrical connection terminals of the external power supply, respectively. One end of each set of metal conductors is electrically connected to the connecting wires of the circuit base board by soldering, bonding or plugging.

The standard interface structure has a standard interface and is connected to the external interface of the corresponding external conductor through a pluggable method. There are many widely used standard interface in different nations, regions, multi-nations or companies. For example, standard interfaces commonly used in North America, including the IDEAL interface. The IDEAL male connector will be pre-arranged in front of the ceiling wire and then lighting device such as down lighting device will be equipped with the IDEAL female connector. When installing this type of lights, what the installer needs to do is to connect the IDEAL female connector of the lighting device to the IDEAL male connector, so that the indoor power supply can be electrically connected with the lighting device. Specifically, when the user activates the switch, the current passes from the IDEAL male connector to the IDEAL female connector of the lighting device. Then, the current is guided and further converted to a suitable current and transmitted to the corresponding light-emitting component, so that the light-emitting component emits light.

The IDEAL interface is an example of a standard interface described here, but the present invention may not only be used on the IDEAL interface.

As described above, when the external interface is connected with the standard interface, the external wire is electrically connected to the metal conductor, and an external current is supplied to the plurality of light source circuit components through the connecting wires.

In addition, in these embodiments, the circuit base board is clamped by the standard interface structure and the input terminal structure from both sides of the circuit base board. For example, the circuit base board may be a disk, on which a LED and a driver circuit are disposed. Here, the standard interface structure and the input terminal structure are respectively disposed on both sides of the disk, and the circuit base board is clamped in the middle by various possible ways. In other words, the standard interface structure and the main body of the input terminal structure are disposed on two sides of the circuit base board, respectively.

In a related embodiment, the circuit base board may have terminal holes. The standard interface structure and the input terminal structure are two separable components. And a connecting portion between the standard interface structure and the input terminal structure passes through the terminal holes. In other words, in one embodiment type, the standard interface structure and the input terminal structure are two separated components and are separately manufactured. When the lighting device is assembled, the standard interface structure and the input terminal structure clamp the circuit base board from both sides of the circuit base board, and the standard interface structure and the input terminal structure are connected to each other through the terminal holes in a combined manner. Through such a combined connection, the circuit base board is clamped in the middle, and the standard interface structure and the input terminal structure are connected together.

In another embodiment, the standard interface structure and the input terminal structure can be fabricated in the same mold at one time. The combination of the standard interface structure and the input terminal structure can pass through the terminal holes to keep the circuit base board clamped in the middle. For example, the lumbar position of the standard interface structure and the input terminal structure may be disposed at a position where the terminal hole horizontally moves to contact with the circuit base board. Then, the standard interface structure and the input terminal structure are fixed together with the circuit base board by means of screws or buckles.

In a further embodiment, the above-mentioned connecting portion is a part of the standard interface structure. The connecting portion extends from one side of the circuit base board to the other side of the circuit base board via the terminal hole. Also, a part of the metal conductor may be inserted into the connecting portion, for example, directly connected to the external conductor or connected to the external conductor through an additional elastic component.

In some embodiments, the input terminal structure may provide with a groove for receiving the connecting portion. For example, when the connecting portion of the standard interface structure extends through the terminal hole to the other side of the circuit base board, the extended portion can be snapped into the corresponding groove of the input terminal structure. This can further increase the stability of the connection between the standard interface structure and the input terminal structure.

Of course, in addition to the grooves, the rails, snaps, receiving holes, etc. can also be different options for design. Alternatively, the connecting portion can be designed with a hole or groove, and then the input terminal connecting portion can be inserted into this hole or groove, which is also an option for design.

In related embodiments, the input terminal structure may also provide with a positioning column, correspondingly inserted into the positioning hole of the circuit base board. On the other hand, the standard interface structure may also provide with a positioning column, correspondingly inserted into the positioning holes of the circuit base board. The positioning column mentioned herein refers to the protrusion corresponding to the positioning hole, which may be a part of the plastic housing or an additional screw. Through the positioning column and the positioning hole, the input terminal structure and the standard interface structure can be fixed more stably.

In addition, in some embodiments, the standard interface of the standard interface structure may further have two corresponding elastic guides. The two elastic guides may be electrically connected with the metal conductor of the input terminal structure. And when the external interface is connected to the standard interface, the elastic guide offers an elastic force to maintain the electrical connection with the corresponding wire of the external interface. For example, the two the elastic guides can maintain a better electrical connection with the corresponding wire or tab of the external interface by elastic force.

As described above, the input terminal structure and the standard interface structure clamp the circuit base board. In order to allow the input terminal structure to stand on the circuit base board more stably, one or more engaging foot structures may be disposed on the input terminal structure to abut the surface of the circuit base board. The engaging foots mentioned herein include various plastic or metal structures, for allowing the input terminal structure to stably stand on the circuit base board when clamping the circuit base board.

In addition, the input terminal structure may further comprise a metal fixing component, fixed with the plastic housing of the input terminal, and fixed to the circuit base board by soldering. For example, a groove can be designed on the input terminal structure and an L-shaped metal strip can be placed. The L-shaped metal strip is partially fixed to the input terminal structure, and the other portion is fixed to the circuit base board by soldering or the like.

In some embodiments, such as down lights, the lighting device may further comprise an outer housing. The outer housing covers the metal base board and the standard interface structure. And the outer housing has an interface hole, such that the standard interface exposes a connection area through the interface hole, so that the external interface of the external wire can be connected to the standard interface.

Generally, the standard interface, such as the IDEAL female connector, has a certain height. If the whole standard interface structure and the input terminal structure are all arranged on one side of the circuit base board, the whole thickness of the lighting device will not be reduced easily. If you use the above way to design lighting device, even if the standard interface such as IDEAL female connector has a certain height, since the input terminal structure is designed on the other side, and when the male connector, such as IDEAL, is connected to the female connector, such as IDEAL, it may even extend, or partially extend to the other side of the circuit base board through the terminal hole. Therefore, this design can further reduce the overall thickness of the lighting device.

In addition, in some embodiments, the lighting device may further comprise a lightshade. The lightshade has a transparent area such that the plurality of light source circuit components on the metal base board provide illumination to the outside through the transparent area. For example, the transparent area is fully transparent or foggy or micro-lens or other transparent structure. The lightshade mentioned here does not have to be a single component, which can include the combination of light-transmissive sheet, metal ring, diffusion portion, etc.

In some embodiments, the metal conductor may be a U-shaped metal strip. This U-shaped metal strip has an input portion, a curved portion and an interface portion. The input portion is electrically connected to the connecting wire of the metal base board. The curved portion is fixed to the plastic housing. The interface portion extends toward the standard interface for electrical connection with the external wires.

In some embodiments, the plastic housing of the input terminal structure may be a bridge structure. The bridge structure has two legs abutting the metal base board. The curved portion of the metal strip partially straddles the top of the bridge structure.

And the input portion of the metal conductor may extend from the curved portion to a position where an angle between the direction of the metal base board and the horizontal line of the metal base board is greater than 90 degrees. Or, more specifically, the input portion of the metal conductor may extend from the curved portion to a position where the angle between the direction of the metal base board and the horizontal line of the metal base board is from 100 to 130 degrees.

In some embodiments, the metal base board has terminal hole. An interface portion of the metal conductor extends from one side of the metal base board to the other side of the metal base board through the terminal hole. In other words, the metal conductor of the input terminal structure extends to the other side of the circuit base board.

In some embodiments, the standard interface structure has a connecting portion. The connecting portion extends from one side of the circuit base board to the other side of the circuit base board via the terminal hole, and the interface portion of the metal conductor may be inserted into the connecting portion.

In some embodiments, the electrical connection terminal module is disposed in the peripheral region of the metal base board, and the LED components of the plurality of light source circuit components are disposed in the central region of the metal base board.

In some embodiments, the lighting device may have a transparent lightshade disposed above the LED components, and the transparent lightshade has a nontransparent portion such as a diffusion portion for concealing the electrical connection terminal module.

DETAILED DESCRIPTION

An embodiment of the present invention provides a lighting device that includes a plurality of light source circuit components, a circuit base board and an electrical connector module.

The circuit base board is used for carrying the plurality of light source circuit components. The light source circuit components mentioned herein may include, but are not limited to, LED components and corresponding driver circuit.

According to an embodiment of the present invention, the circuit base board is used only for providing light source circuit components such as driver circuit, and another light source board is used for carrying light emitting components such as LED components.

According to another embodiment of the present invention, a LED component and a driver circuit required thereon are simultaneously arranged on the circuit base board. For this type, currently there is a used term called DOB (Driver on Board).

These driver circuit components and the LED components are connected to each other through the connecting wires of the circuit base board. It must be noted that the connecting wire mentioned here does not necessarily need to be in the form of a strip conductor, but may be in various forms that provide the electrical connection for the circuit components. For example, the circuit base board may have one or more conductor layers that are responsible for electrical connection for the circuit components, which should be connected. In addition, fixed or non-fixed wires may be soldered on the surface of the circuit base board to connect different circuit components. In addition, a metal foil of various geometric shapes may also be disposed on the circuit base board for connecting the LED components and heat dissipating.

In these embodiments, an electrical connection terminal module is further included. The electrical connection terminal module has a standard interface structure and an input terminal structure, and the input terminal structure has a plastic housing and a metal conductor. In different embodiments, the metal conductor mentioned herein may be metal wire, metal strip, metal clip, or a plurality of interconnected metal parts, and may further include related circuit, such as fuse, controller, communication component, etc.

The metal conductor is positioned through the plastic housing. In other words, the plastic housing provides proper support by means of a mold or the like as required. The metal conductors are mounted on the interior, the surface or other positions of the plastic housing so that the metal conductors can be fixed in a predetermined position.

The metal conductor is electrically connected to the connecting wires of the circuit base board. For example, there are two sets of metal conductors, corresponding to the two electrical connection terminals of the external power supply, respectively. One end of each set of metal conductors is electrically connected to the connecting wires of the circuit base board by soldering, bonding or plugging.

The standard interface structure has a standard interface and is connected to the external interface of the corresponding external conductor through a pluggable method. There are many widely used standard interface in different nations, regions, multi-nations or companies. For example, standard interfaces commonly used in North America, including the IDEAL interface. The IDEAL male connector will be pre-arranged in front of the ceiling wire and then lighting device such as down lighting device will be equipped with the IDEAL female connector. When installing this type of lights, what the installer needs to do is to connect the IDEAL female connector of the lighting device to the IDEAL male connector, so that the indoor power supply can be electrically connected with the lighting device. Specifically, when the user activates the switch, the current passes from the IDEAL male connector to the IDEAL female connector of the lighting device. Then, the current is guided and further converted to a suitable current and transmitted to the corresponding light-emitting component, so that the light-emitting component emits light.

The IDEAL interface is an example of a standard interface described here, but the present invention may not only be used on the IDEAL interface.

As described above, when the external interface is connected with the standard interface, the external wire is electrically connected to the metal conductor, and an external current is supplied to the plurality of light source circuit components through the connecting wires.

In addition, in these embodiments, the circuit base board is clamped by the standard interface structure and the input terminal structure from both sides of the circuit base board. For example, the circuit base board may be a disk, on which a LED and a driver circuit are disposed. Here, the standard interface structure and the input terminal structure are respectively disposed on both sides of the disk, and the circuit base board is clamped in the middle by various possible ways. In other words, the standard interface structure and the main body of the input terminal structure are disposed on two sides of the circuit base board, respectively.

Figure 1:
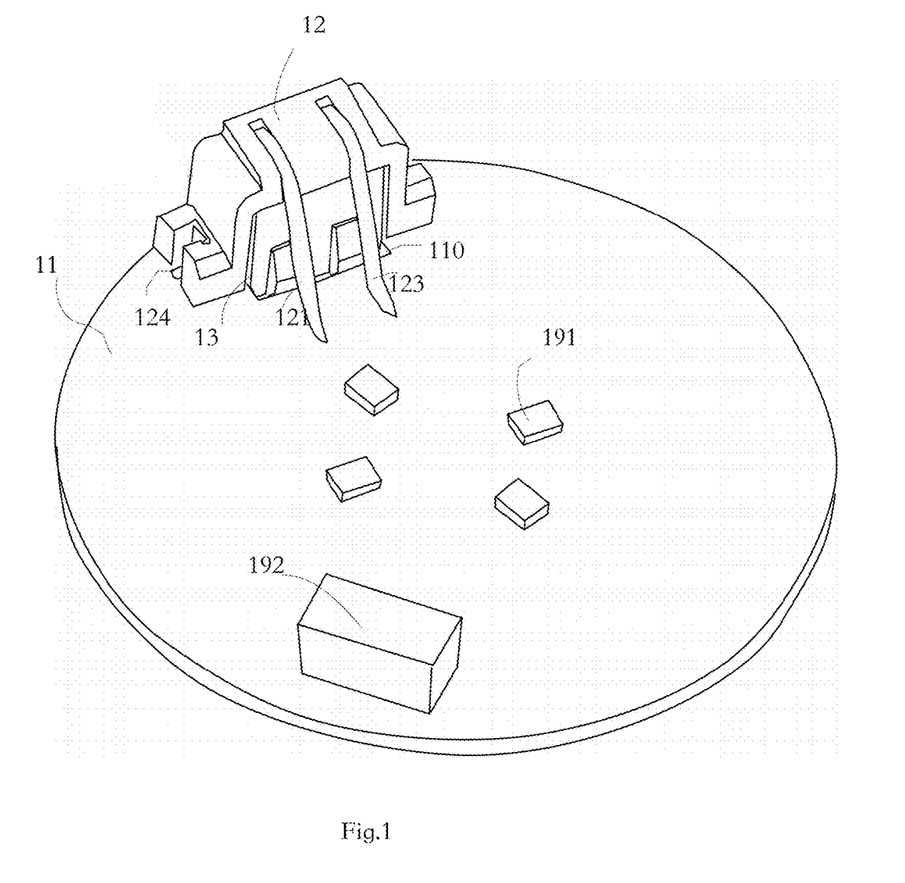
FIG. 1 illustrates a schematic view of a part of components according to the lighting device embodiment of the present invention.
Figure 2:
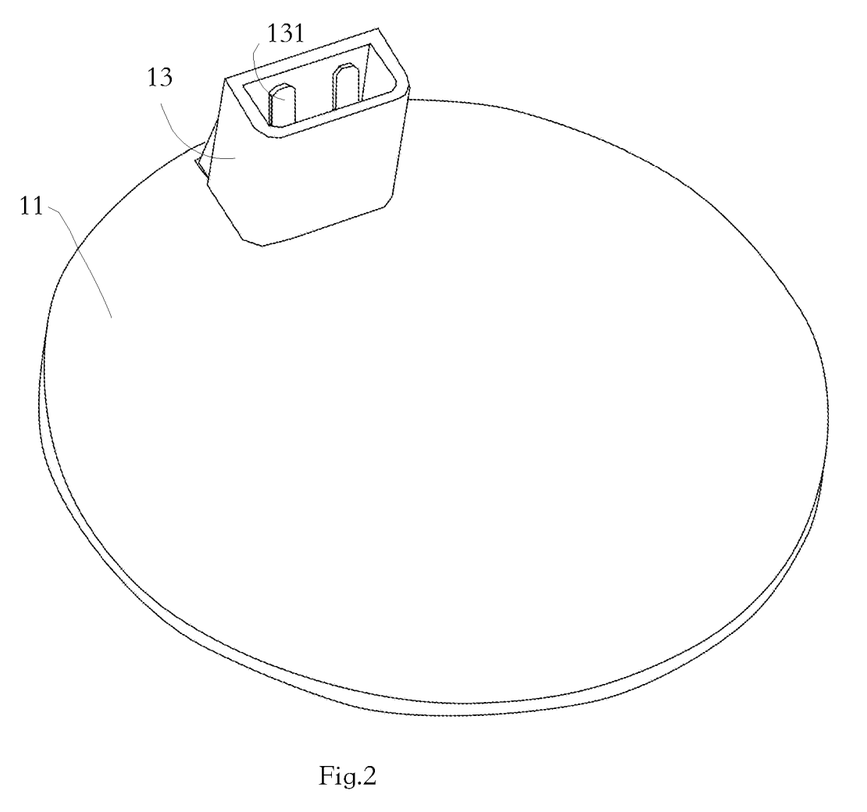
FIG. 2 illustrates a schematic view of the components on the back of the embodiment in FIG. 1.
Figure 3:
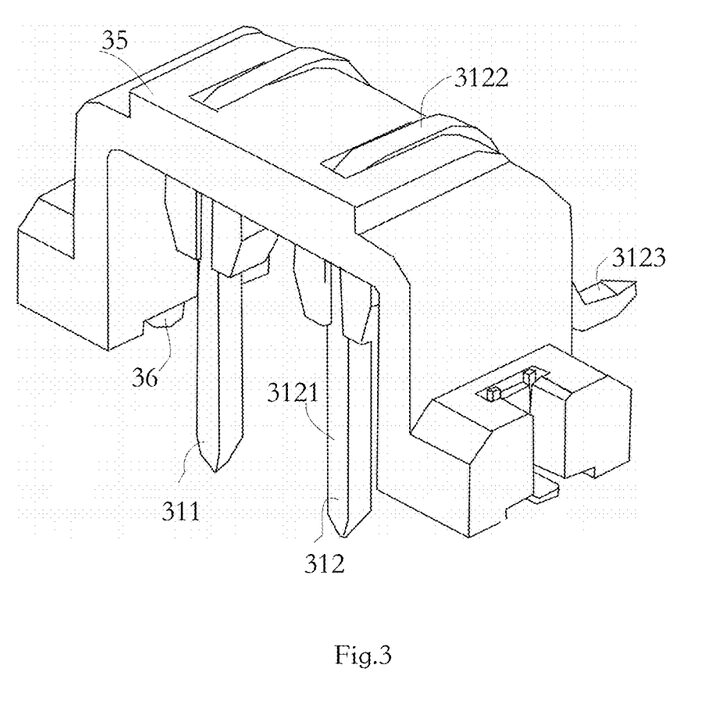
FIG. 3 illustrates a schematic view of the components electrically connected with terminal module.
Figure 4:
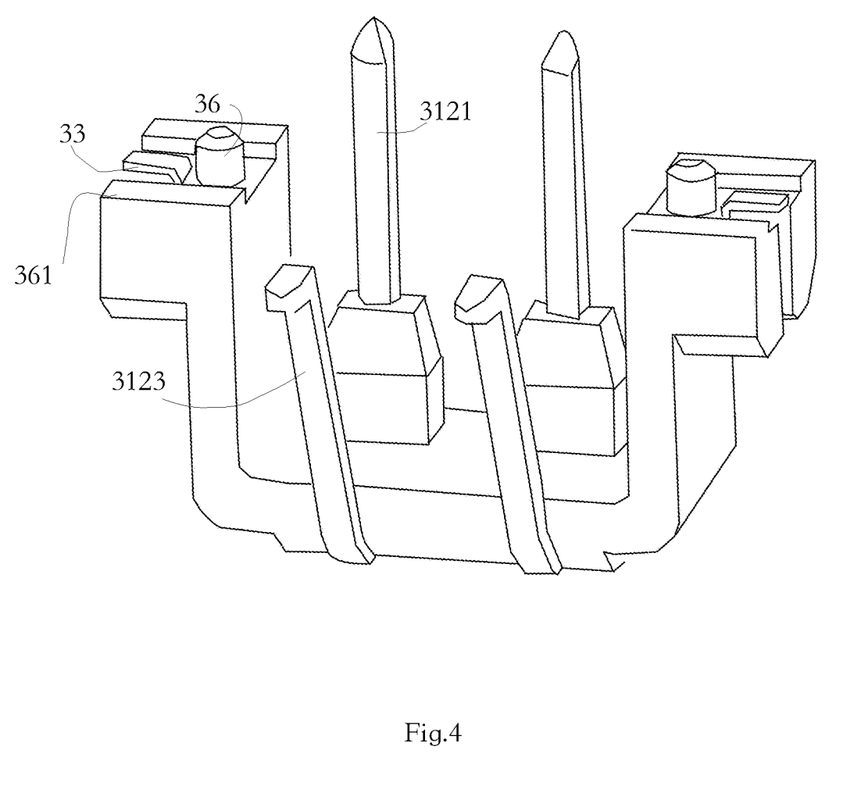
FIG. 4 illustrates a schematic view of the opposite angle of the embodiment in FIG. 3.
Figure 5:
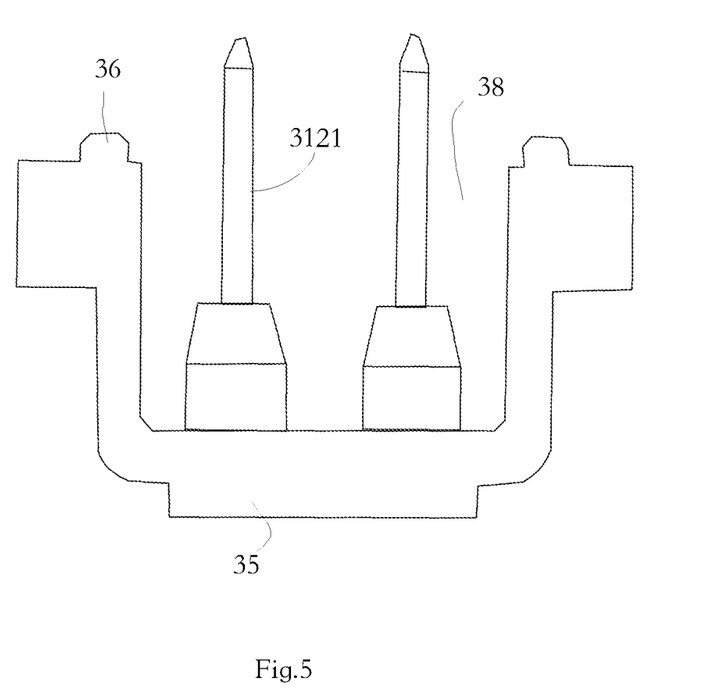
FIG. 5 illustrates a schematic side sectional view of the embodiment in FIG. 3
Figure 6:
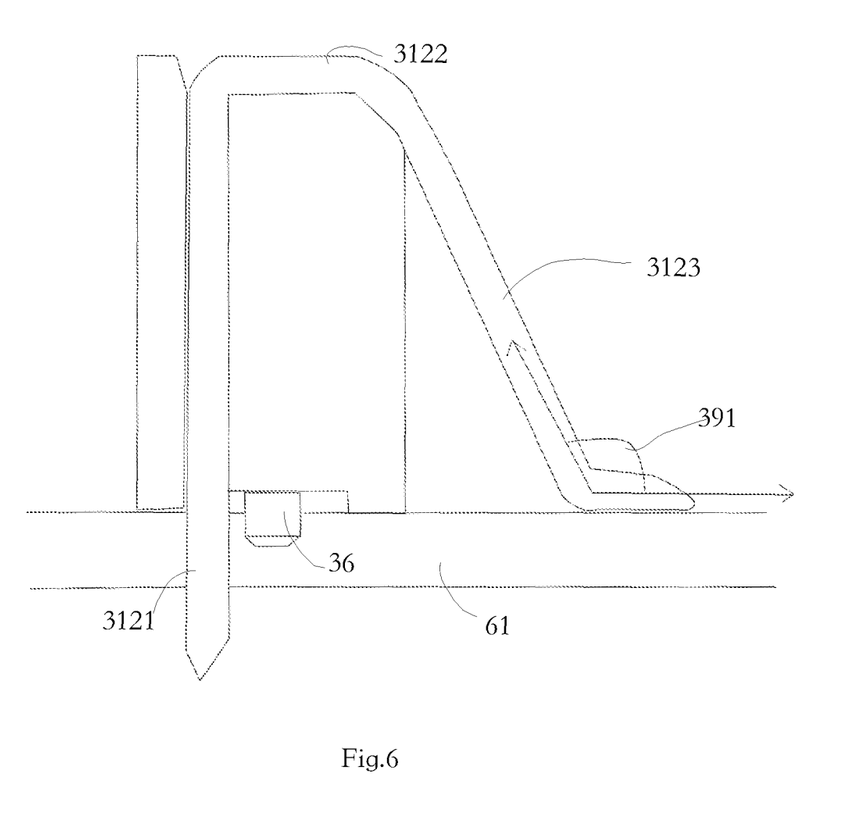
FIG. 6 illustrates a schematic sectional view of another angle of the embodiment in FIG. 3.

Please refer to FIG. 1 and FIG. 2. FIG. 1 illustrates a schematic view of a part of components according to the lighting device embodiment of the present invention. FIG. 2 illustrates a schematic view of the components on the back of the embodiment in FIG. 1.

In the embodiment in FIG. 1 and FIG. 2, the input terminal structure 12 is a bridge structure, and provided on one side of the circuit base board 11. The standard interface structure 13 is provided on the other side of the circuit base board 11. The input terminal structure 12 and the standard interface structure 13 clamp the circuit base board 11.

The body of the standard interface structure 13 and input terminal structure 12 can be made of plastic, by various mold processes. It can be two separate components or an integral component. The standard interface structure 13 has a connecting portion, extending from one side of the circuit base board 11 to the other side through the terminal hole 110 and inserted into a groove of the input terminal structure 12.

In addition, in this embodiment, the input terminal structure 12 has an L-shaped metal strip 124 that can help to stabilize the fixed connection of the input terminal structure 12 to the circuit base board 11.

The standard interface structure 13 has a standard interface, provided with a conductive elastic guide. When the external interface of the external wire is connected to the standard interface 13, the current is transmitted to the elastic guide 131, and then the elastic guide 131 further transmit the current to the conductors 121, 123 of the input terminal structure 12. The conductors 121 and 123 are electrically connected to the LED component 191 and the driver circuit 192 on the circuit base board 11 and provide a driving current.

In a related embodiment, the circuit base board may have terminal holes. The standard interface structure and the input terminal structure are two separable components. And a connecting portion between the standard interface structure and the input terminal structure passes through the terminal holes. In other words, in one embodiment type, the standard interface structure and the input terminal structure are two separated components and are separately manufactured. When the lighting device is assembled, the standard interface structure and the input terminal structure clamp the circuit base board from both sides of the circuit base board, and the standard interface structure and the input terminal structure are connected to each other through the terminal holes in a combined manner. Through such a combined connection, the circuit base board is clamped in the middle, and the standard interface structure and the input terminal structure are connected together.

In another embodiment, the standard interface structure and the input terminal structure can be fabricated in the same mold at one time. The combination of the standard interface structure and the input terminal structure can pass through the terminal holes to keep the circuit base board clamped in the middle. For example, the lumbar position of the standard interface structure and the input terminal structure may be disposed at a position where the terminal hole horizontally moves to contact with the circuit base board. Then, the standard interface structure and the input terminal structure are fixed together with the circuit base board by means of screws or buckles.

In a further embodiment, the above-mentioned connecting portion is a part of the standard interface structure. The connecting portion extends from one side of the circuit base board to the other side of the circuit base board via the terminal hole. Also, a part of the metal conductor may be inserted into the connecting portion, for example, directly connected to the external conductor or connected to the external conductor through an additional elastic component.

In some embodiments, the input terminal structure may provide with a groove for receiving the connecting portion. For example, when the connecting portion of the standard interface structure extends through the terminal hole to the other side of the circuit base board, the extended portion can be snapped into the corresponding groove of the input terminal structure. This can further increase the stability of the connection between the standard interface structure and the input terminal structure.

Of course, in addition to the grooves, the rails, snaps, receiving holes, etc. can also be different options for design. Alternatively, the connecting portion can be designed with a hole or groove, and then the input terminal connecting portion can be inserted into this hole or groove, which is also an option for design.

In related embodiments, the input terminal structure may also provide with a positioning column, correspondingly inserted into the positioning hole of the circuit base board. On the other hand, the standard interface structure may also provide with a positioning column, correspondingly inserted into the positioning holes of the circuit base board. The positioning column mentioned herein refers to the protrusion corresponding to the positioning hole, which may be a part of the plastic housing or an additional screw. Through the positioning column and the positioning hole, the input terminal structure and the standard interface structure can be fixed more stably.

In addition, in some embodiments, the standard interface of the standard interface structure may further have two corresponding elastic guides. The two elastic guides may be electrically connected with the metal conductor of the input terminal structure. And when the external interface is connected to the standard interface, the elastic guide offers an elastic force to maintain the electrical connection with the corresponding wire of the external interface. For example, the two the elastic guides can maintain a better electrical connection with the corresponding wire or tab of the external interface by elastic force.

As described above, the input terminal structure and the standard interface structure clamp the circuit base board. In order to allow the input terminal structure to stand on the circuit base board more stably, one or more engaging foot structures may be disposed on the input terminal structure to abut the surface of the circuit base board. The engaging foots mentioned herein include various plastic or metal structures, for allowing the input terminal structure to stably stand on the circuit base board when clamping the circuit base board.

In addition, the input terminal structure may further comprise a metal fixing component, fixed with the plastic housing of the input terminal, and fixed to the circuit base board by soldering. For example, a groove can be designed on the input terminal structure and an L-shaped metal strip can be placed. The L-shaped metal strip is partially fixed to the input terminal structure, and the other portion is fixed to the circuit base board by soldering or the like.

In some embodiments, the metal conductor may be a U-shaped metal strip. This U-shaped metal strip has an input portion, a curved portion and an interface portion. The input portion is electrically connected to the connecting wire of the metal base board. The curved portion is fixed to the plastic housing. The interface portion extends toward the standard interface for electrical connection with the external wires.

In some embodiments, the plastic housing of the input terminal structure may be a bridge structure. The bridge structure has two legs abutting the metal base board. The curved portion of the metal strip partially straddles the top of the bridge structure.

And the input portion of the metal conductor may extend from the curved portion to a position where an angle between the direction of the metal base board and the horizontal line of the metal base board is greater than 90 degrees. Or, more specifically, the input portion of the metal conductor may extend from the curved portion to a position where the angle between the direction of the metal base board and the horizontal line of the metal base board is from 100 to 130 degrees.

In some embodiments, the metal base board has terminal holes. An interface portion of the metal conductor extends from one side of the metal base board to the other side of the metal base board through the terminal hole. In other words, the metal conductor of the input terminal structure extends to the other side of the circuit base board.

In some embodiments, the standard interface structure has a connecting portion. The connecting portion extends from one side of the circuit base board to the other side of the circuit base board via the terminal hole, and the interface portion of the metal conductor may be inserted into the connecting portion.

Please further refer to FIG. 3, FIG. 4, FIG. 5 and FIG. 6. These four figures illustrate different schematic views of one embodiment of the input terminal structure with different angle according to the present invention.

In this embodiment, the input terminal structure 35 has two conductors 311, 312 of U-shaped metal strips. The U-shaped metal bar 312 has an input portion 3123, a curved portion 3122 and an interface portion 3121. The curved portion of the input terminal structure 35 partially spans the top of the plastic housing. The input portion 3123 is used for connecting the connecting wires of the circuit base board 61 and further for supplying current to the light source circuit components on the circuit base board 61.

The input portion of the metal conductor may extend from the curved portion to a position where the angle 391 between the direction of the metal base board and the horizontal line of the metal base board is from 100 to 130 degrees.

In this embodiment, it can be seen that the plastic housing has two positioning columns 36 extending therein and can be inserted into corresponding positioning holes of the circuit base board 61. In addition, the bridge-shaped plastic housing has two legs 361 that can abut to the circuit base board 61 to more stably support the input terminal structure 35.

In addition, the plastic housing has a groove 38 for receiving the connecting portion of the standard interface structure.

Figure 7:
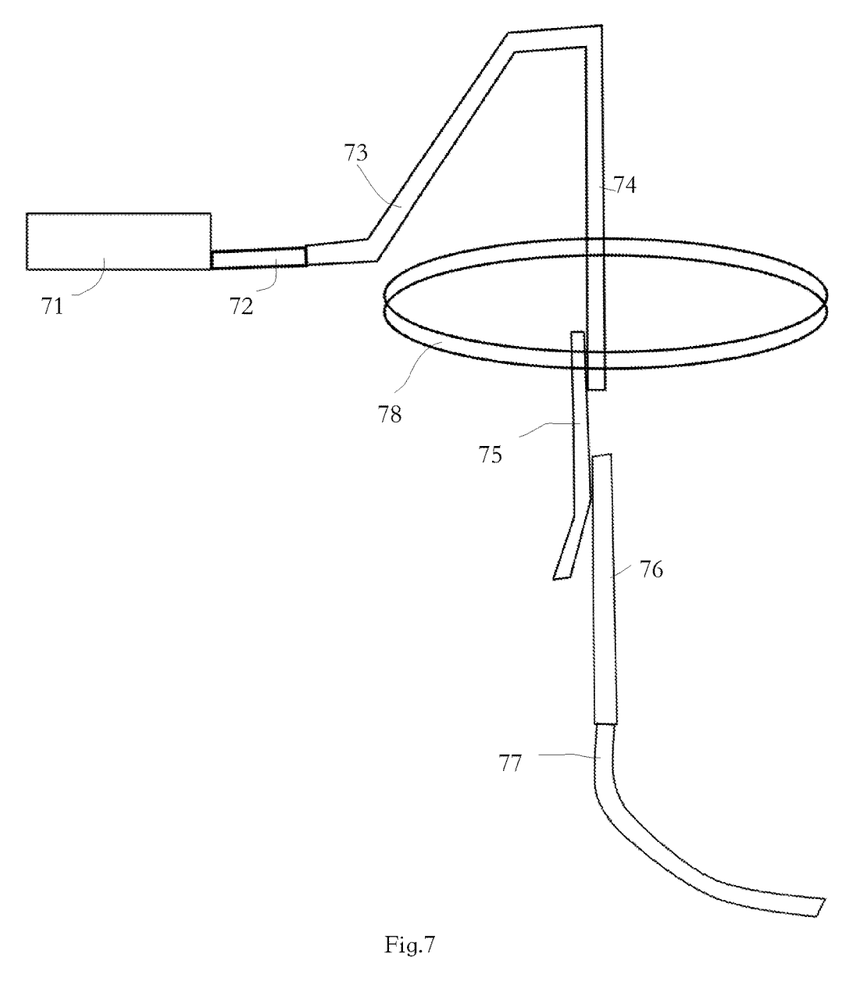
FIG. 7 illustrates a schematic view of electrical connection of the component of the embodiment

Next, please refer to FIG. 7. FIG. 7 illustrates a schematic view of electrical connection of the component of the embodiment.

The light source circuit component 71 on the base board is connected to the input portion 73 of the conductor of the input terminal structure through the connecting wire 72. The input portion 73 and the interface portion 74 of the conductor are in different positions of the same component, in this embodiment. The interface portion 74 passes through the terminal hole 78 and is connected to the elastic guide 75 of the standard interface. The elastic guide 75 of the standard interface is further connected to the conductor 76 of the external interface and is then connected to the external power source in the room through the wire 77 of the external interface.

In some embodiments, such as down lights, the lighting device may further comprise an outer housing. The outer housing covers the metal base board and the standard interface structure. And the outer housing has an interface hole, such that the standard interface exposes a connection area through the interface hole, so that the external interface of the external wire can be connected to the standard interface.

In addition, in some embodiments, the light device may further comprise a lightshade. The lightshade has a transparent area such that the plurality of light source circuit components on the metal base board provide illumination to the outside through the transparent area. For example, the transparent area is fully transparent or foggy or micro-lens or other transparent structure. The lightshade mentioned here does not have to be a single component, which can include the combination of light-transmissive sheet, metal ring, diffusion portion, etc.

In some embodiments, the electrical connection terminal module is disposed in the peripheral region of the metal base board, and the LED components of the plurality of light source circuit components are disposed in the central region of the metal base board.

In some embodiments, the lighting device may have a transparent lightshade disposed above the LED components, and the transparent lightshade has a nontransparent portion such as a diffusion portion for concealing the electrical connection terminal module.

Figure 8:
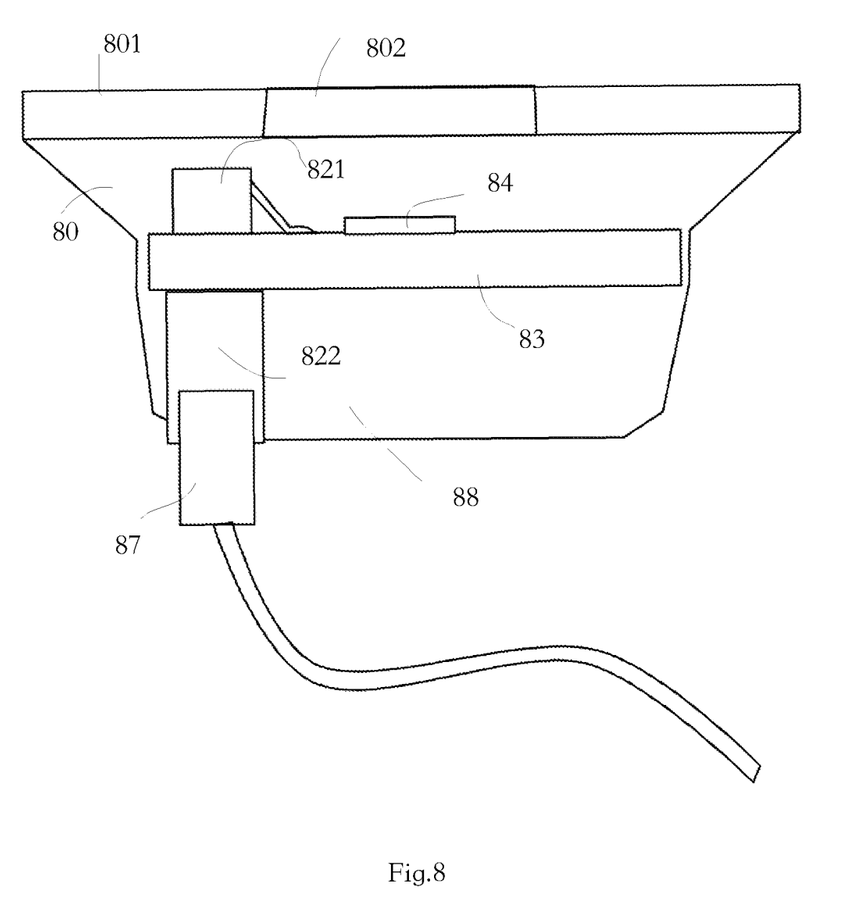
FIG. 8 illustrates a schematic view of a down light according to the lighting device embodiment of the present invention.

Please refer to FIG. 8, illustrates a schematic view of a down light according to the lighting device embodiment of the present invention.

In FIG. 8, the LED component 84 is arranged the middle area of the circuit base board 83, and the transparent lightshade 802 is provided over the LED component 84. The LED component 84 is electrically connected to the input terminal structure 821 through the driver circuit and connecting wire. The input terminal structure 821 and the standard interface structure 822 clamp the circuit base board 83. The lightshade may be provided with a diffusion layer or an opaque portion above the input terminal structure 821, so as to cover the input terminal structure 821. The housing 80 can be an integral plastic component or a component added various heat dissipation and reflected light path. The outer housing 88 of the housing has an interface hole so that the external interface 87 of the outer wire can be inserted into the standard interface structure 822.

Generally, the standard interface, such as the IDEAL female connector, has a certain height. If the whole standard interface structure and the input terminal structure are all arranged on one side of the circuit base board, the whole thickness of the lighting device will not be reduced easily. If you use the above way to design lighting device, even if the standard interface such as IDEAL female connector has a certain height, since the input terminal structure is designed on the other side, and when the male connector, such as IDEAL, is connected to the female connector, such as IDEAL, it may even extend, or partially extend to the other side of the circuit base board through the terminal hole. Therefore, this design can further reduce the overall thickness of the lighting device.

In addition to the above-described embodiments, various modifications may be made, and as long as it is within the spirit of the same invention, the various designs that can be made by those skilled in the art are belong to the scope of the present invention.

The invention claimed is:

1. A lighting device, comprising:
a plurality of light source circuit components;
a circuit base board, for carrying said plurality of light source circuit components, said plurality of light source circuit components electrically connected to each other through a connecting wire of said circuit base board; and
an electrical connector module, provided with a standard interface structure and an input terminal structure, said input terminal structure provided with a plastic housing and a metal conductor, said metal conductor positioned through said plastic housing, and said metal conductor electrically connected to said connecting wire of said circuit base board, said standard interface structure provided with a standard interface and connected to an external interface of a corresponding external conductor through a pluggable method, when said external interface connected with said standard interface, an external wire electrically connected to said metal conductor, and an external current provided to said plurality of light source circuit components through said connecting wire, and said standard interface structure and said input terminal structure clamping said circuit base board from two sides of said circuit base board.

2. The lighting device of claim 1, wherein said circuit base board has terminal holes, said standard interface structure and said input terminal structure are two separable components, and a connecting portion between said standard interface structure and said input terminal structure passes through said terminal holes.

3. The lighting device of claim 2, wherein said connecting portion is a part of said standard interface structure, extending from one side of said circuit base board to the other side of said circuit base board via said terminal hole, and a part of said metal conductor inserted into said connecting portion.

4. The lighting device of claim 3, wherein said input terminal structure has a groove for receiving said connecting portion.

5. The lighting device of claim 3, wherein said input terminal structure has a positioning column, correspondingly inserted into said positioning hole of said circuit base board.

6. The lighting device of claim 3, wherein said standard interface of said standard interface structure further have two corresponding elastic guides, electrically connected with said metal conductor of said input terminal structure, and when said external interface connected to said standard interface, said elastic guide offering an elastic force to maintain said electrical connection with said corresponding wire of said external interface.

7. The lighting device of claim 1, wherein said standard interface structure is an IDEAL female interface.

8. The lighting device of claim 1, wherein said input terminal structure further comprises an engaging foot structure, abutted the surface of said circuit base board to maintain the stability of said input terminal structure fixed on said circuit base board.

9. The lighting device of claim 1, wherein said input terminal structure further comprises a metal fixing component, fixed with the plastic housing of said input terminal, and fixed to said circuit base board by soldering.

10. The lighting device of claim 1, wherein said plurality of light source circuit components comprise a LED component and a driver circuit component.

11. The lighting device of claim 1, further comprising an outer housing, covering a metal base board and said standard interface structure, and said outer housing having an interface hole, such that said standard interface exposes a connection area through said interface hole, so that said external interface of said external wire is connected to said standard interface.

12. The lighting device of claim 1, further comprising a lightshade, said lightshade having a transparent area such that said plurality of light source circuit components on said metal base board provide illumination to the outside through said transparent area.

13. The lighting device of claim 1, wherein said metal conductor is a U-shaped metal strip, providing an input portion, a curved portion and an interface portion, said input portion electrically connected to said connecting wire of said metal base board, said curved portion fixed to said plastic housing, said interface portion extended toward said standard interface for electrical connection with said external wires.

14. The lighting device of claim 13, wherein said plastic housing of said input terminal structure is a bridge structure, provided with two legs abutting said metal base board, said curved portion of said metal strip partially straddled the top of said bridge structure.

15. The lighting device of claim 14, wherein the input portion of said metal conductor extends from said curved portion to a position where an angle between the direction of said metal base board and the horizontal line of said metal base board is greater than 90 degrees.

16. The lighting device of claim 15, wherein said he input portion of said metal conductor extends from said curved portion to a position where an angle between the direction of said metal base board and the horizontal line of said metal base board is from 100 to 130 degrees.

17. The lighting device of claim 13, wherein said metal base board has a terminal hole, the interface portion of said metal conductor extended from one side of said metal base board to the other side of said metal base board through said terminal hole.

18. The lighting device of claim 17, wherein said standard interface structure has a connecting portion, extended from one side of said circuit base board to the other side of said circuit base board via said terminal hole, and said interface portion of said metal conductor inserted into said connecting portion.

19. The lighting device of claim 13, wherein said electrical connection terminal module is disposed in the peripheral region of said metal base board, and the LED components of said plurality of light source circuit components are disposed in the central region of said metal base board.

20. The lighting device of claim 19, further comprises a transparent lightshade, disposed above said LED components, and said transparent lightshade having a nontransparent portion for concealing said electrical connection terminal module.

* * * * *